(12) United States Patent
Glatts, III

(10) Patent No.: US 6,350,132 B1
(45) Date of Patent: Feb. 26, 2002

(54) ELASTOMERIC CONNECTOR AND ASSOCIATED METHOD OF MANUFACTURE

(76) Inventor: George F. Glatts, III, 2009 Carmel Dr., Jamison, PA (US) 18929

( * ) Notice: Subject to any disclaimer, the term of this patent is extended or adjusted under 35 U.S.C. 154(b) by 0 days.

(21) Appl. No.: 09/451,037

(22) Filed: Nov. 29, 1999

Related U.S. Application Data

(63) Continuation-in-part of application No. 09/197,885, filed on Nov. 23, 1998, now Pat. No. 6,019,610.

(51) Int. Cl.7 .............................................. H01R 12/00
(52) U.S. Cl. ........................................... 439/66; 29/850
(58) Field of Search .............................. 439/66, 71, 81, 439/91, 515, 733.1, 591; 29/872, 882, 883, 846, 850

(56) References Cited

U.S. PATENT DOCUMENTS

| | | | | |
|---|---|---|---|---|
| 4,509,099 A | * | 4/1985 | Takamatsu et al. | 361/789 |
| 4,516,820 A | * | 5/1985 | Kuzma | |
| 4,998,885 A | * | 3/1991 | Beaman | 439/66 |
| 5,101,553 A | * | 4/1992 | Carey et al. | 29/882 |
| 5,403,194 A | * | 4/1995 | Yamazaki | 439/66 |
| 5,427,535 A | * | 6/1995 | Sinclair | 439/66 |
| 5,805,424 A | * | 9/1998 | Purinton | 361/760 |
| 5,967,804 A | * | 10/1999 | Yoshizawa et al. | 439/91 |

* cited by examiner

Primary Examiner—Brian Sircus
Assistant Examiner—Michael C. Zarroli
(74) Attorney, Agent, or Firm—LaMorte & Associates

(57) ABSTRACT

What is disclosed is a elastomeric connector and the associated method used to manufacture the elastomeric connector. The elastomeric connector includes a segment of a dielectric substrate having a top surface and a bottom surface. A plurality of conductive elements are positioned within the dielectric substrate in a predetermined pattern. Portions of the conductive elements lay exposed on the top surface and the bottom surface of the dielectric substrate within the selected pattern. Accordingly, any contacts that abut against the top surface and the bottom surface of the elastomeric connector will be electrically interconnected by the conductive wire. Each of the conductive elements is configured in a manner that prevents the dielectric substrate from enveloping the conductive elements at the points where they enter the dielectric substrate.

11 Claims, 3 Drawing Sheets

ELASTOMERIC CONNECTOR AND ASSOCIATED METHOD OF MANUFACTURE

RELATED APPLICATIONS

This application is a Continuation-In-Part of U.S. application Ser. No. 09/197,885, filed on Nov. 23, 1998 now U.S. Pat. No. 6,019,610.

BACKGROUND OF THE INVENTION

1. Field of the Invention

The present invention relates to elastomeric connectors that are used to electrically interconnect contact areas on opposing surfaces by compressing the elastomeric connectors between the opposing surfaces. More specifically, the present invention relates to the structure of elastomeric connectors and the methods used to manufacture elastomeric connectors.

2. Prior Art Statement

As electronic circuitry becomes smaller and more densely populated with components, it is often difficult to interconnect separate electronic circuits using traditional soldering techniques. The difficulty of using solder is particularly evident when contact areas on opposing circuit boards must be joined. In the prior art, land grid arrays were commonly placed between opposing contact areas. The land grid arrays were then soldered in place to both contact areas. However, due to many variables, such as temperature stress, plating variations, substrate warpage and the like, such soldered connections often proved unreliable.

In an attempt to improve the reliability of connections between opposing contact surfaces, elastomeric connectors have been developed. Elastomeric connectors contain conductive elements that are suspended in an elastomeric substrate. The conductive elements are exposed on the top surface and bottom surface of the elastomeric substrate. When the elastomeric connector is placed between opposing contact points, the contact points contact the conductive elements that are contained within the elastomeric connector, thereby creating an electrical interconnection. The elastomeric material suspending the conductive elements allows the conductive elements to expand and contract as needed in between the opposing contact points without disrupting the electrical interconnection.

In the prior art, elastomeric connectors typically are manufactured by molding elastomeric material around conductive elements. The molded assembly is then often sliced into segments to expose the edges of the conductive elements within the elastomeric material. Such prior art elastomeric connectors are exemplified by U.S. Pat. No. 5,101,553 to Carey, entitled Method Of Making A Metal-On-Elastomer Pressure Contact Connector; and U.S. Pat. No. 4,520,562 to Sado, entitled Method For Manufacturing An Elastic Composite Body With Metal Wires Embedded Therein.

A problem associated with such prior art elastomeric connectors is that they are difficult and expensive to manufacture. The molding of elastomeric material around a dense grouping of conductive wires requires precise molding techniques, expensive molds and exacting premolding set-up tolerances. Furthermore, due to the pressures experienced during molding, ultra thin conductive wires typically are not used because the thin wires can move out of place or break during the molding procedure. Accordingly, using prior art manufacturing techniques, it is very difficult to produce an elastomeric connector with very thin conductive elements that embody a low impedance, a low inductance and a low surface resistance. Such characteristics, however, are required for many types of circuits. Accordingly, elastomeric connectors are not preferred in certain types of circuit designs.

The difficulty in molding elastomeric connectors also limits the shapes into which the elastomeric connectors can be molded. Typically, the shape capable of being produced in the prior art is a generally planar elastomeric connector having a flat top surface and a flat bottom surface. Accordingly, elastomeric connectors are typically not selected in a situation where unusually oriented contact points must be interconnected.

Another problem associated with prior art elastomeric connectors is when the elastomeric connector is compressed and released, the elastomeric material may expand to a degree greater than that of the conductive wires contained within the elastomeric material. As a result, the conductive wires become buried within the elastomeric material. Accordingly, when the elastomeric connector is again compressed, the elastomeric material may shield some of the conductive wires and make the elastomeric connector less conductive.

A need therefore exists in the prior art for an improved elastomeric connector that embodies both a low impedance and a low inductance. The need also exists for an elastomeric connector that can be configured in unusual shapes and can be repeatedly compressed without loss of conductivity due to buried conductive elements.

These needs are met by the present invention as described and claimed below.

SUMMARY OF THE INVENTION

The present invention is an improved elastomeric connector and the associated method used to manufacture the elastomeric connector. The elastomeric connector includes a segment of a dielectric substrate having a top surface and a bottom surface. A plurality of conductive elements are advanced through the dielectric substrate in a predetermined pattern. Portions of the conductive elements lay exposed on the top surface and the bottom surface of the dielectric substrate within the selected pattern. Accordingly, any contacts that abut against the top surface and the bottom surface of the elastomeric connector will be electrically interconnected by the conductive elements. Each of the conductive elements is configured in a manner that prevents the dielectric substrate from enveloping the conductive elements at the points where they enter the dielectric substrate. Accordingly, as the dielectric substrate is repeatedly compressed, the conductive elements resist becoming buried within the material of the dielectric substrate.

The material of the conductive elements, size of the conductive elements and pattern for the conductive elements can be selectively altered to match the elastomeric connector to a desired impedance value. Furthermore, the pattern of the conductive elements can be custom designed for a given application, thereby producing a perfectly matched elastomeric connector for a given application.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE INVENTION

Figure 1:
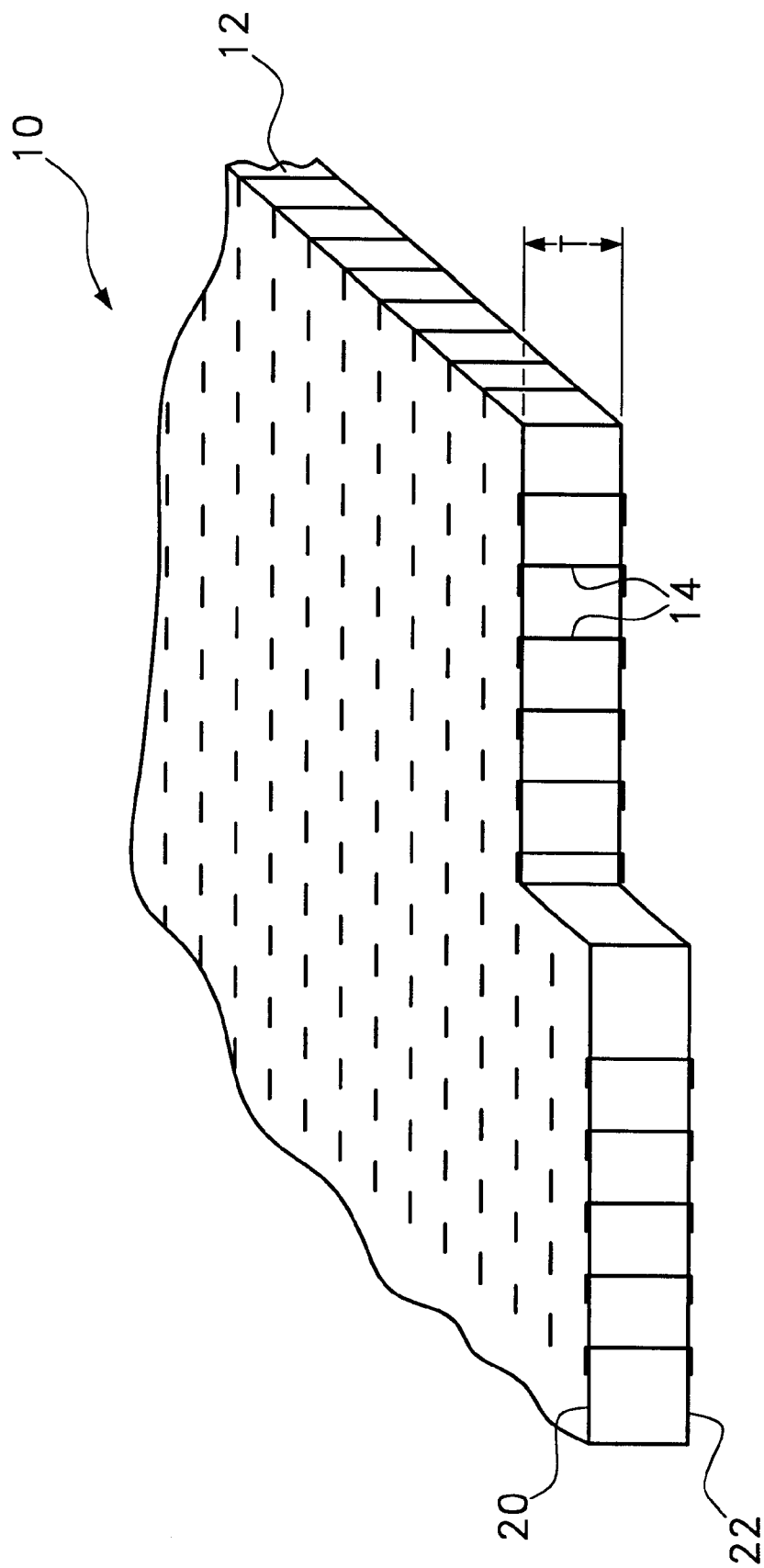
FIG. 1 is a perspective view of an exemplary embodiment of an elastomeric connector in accordance with the present invention.

Referring to FIG. 1, an exemplary embodiment of an elastomeric connector 10 is shown in accordance with the present invention. In the shown embodiment, a segment of dielectric substrate 12 is illustrated having a planar configuration. However, the dielectric substrate 12 can be shaped in any manner desired. The dielectric substrate 12 need not be planar, but rather can have contoured surfaces that provide the substrate with a complex three dimensional design.

The dielectric substrate 12 can be any dielectric material that embodies elastomeric properties. Suitable materials include, but are not limited to, solid silicones, silicone foams, synthetic rubbers, triblock copolymers and styrene polymers. The thickness T of the dielectric substrate 12 can be any desired thickness. However, in most applications the thickness T of the dielectric substrate will be between 0.005 inches to 0.250 inches.

Unlike prior art devices, the dielectric substrate is not molded around segments of conductive wire. Rather, in the present invention elastomeric connector 10, segments of conductive wire 14 are added to a preexisting segment of dielectric substrate 12, by mechanically advancing the segments of conductive wire through the material of the dielectric substrate 12.

In FIG. 1, segments of conductive wire 14 are sewn through the dielectric substrate 12 in a desired pattern. The segments of conductive wire 14 passes vertically through the material of the dielectric substrate 12 and is advanced along the top surface 20 and bottom surface 22 of the dielectric substrate 12, so as to create a classic staple shape. As the segments of conductive wire 14 are advanced along the top surface 20 and bottom surface 22 of the dielectric substrate 12, the conductive wire 14 lays exposed on the top surface 20 and bottom surface 22 of the dielectric substrate 12. Accordingly, any object that were to press against the top surface 20 or the bottom surface 22 of the dielectric substrate 12 would contact at least some of the segments of conductive wire 14. Furthermore, since the conductive wire 14 passes laterally across the top surface 20 of the dielectric substrate 12 and the bottom surface 22 of the dielectric substrate 12, the conductive wire 14 resists being pressed into the elastomeric material of the substrate 12 as the substrate 12 is repeatedly compressed. Accordingly, the conductivity of the elastomeric connector 10 does not degrade over time.

The various segments of conductive wire 14 can by any wire capable of conducting electricity. The width of the conductive wire 14 and the density at the pattern of wire can be selectively altered as desired. Accordingly, the inductance value and impedance value embodied by the elastomeric connector 10 can be selectively altered to match the needed impedance values and inductance values of a particular circuit.

The thickness of the segments of conductive wire 14 can be as narrow as 0.005 inches. Although the conductive wire 14 can be any gauge greater than 0.005 inches, in most applications the thickness of the wire 14 will be below 0.10 inches.

Figure 2:
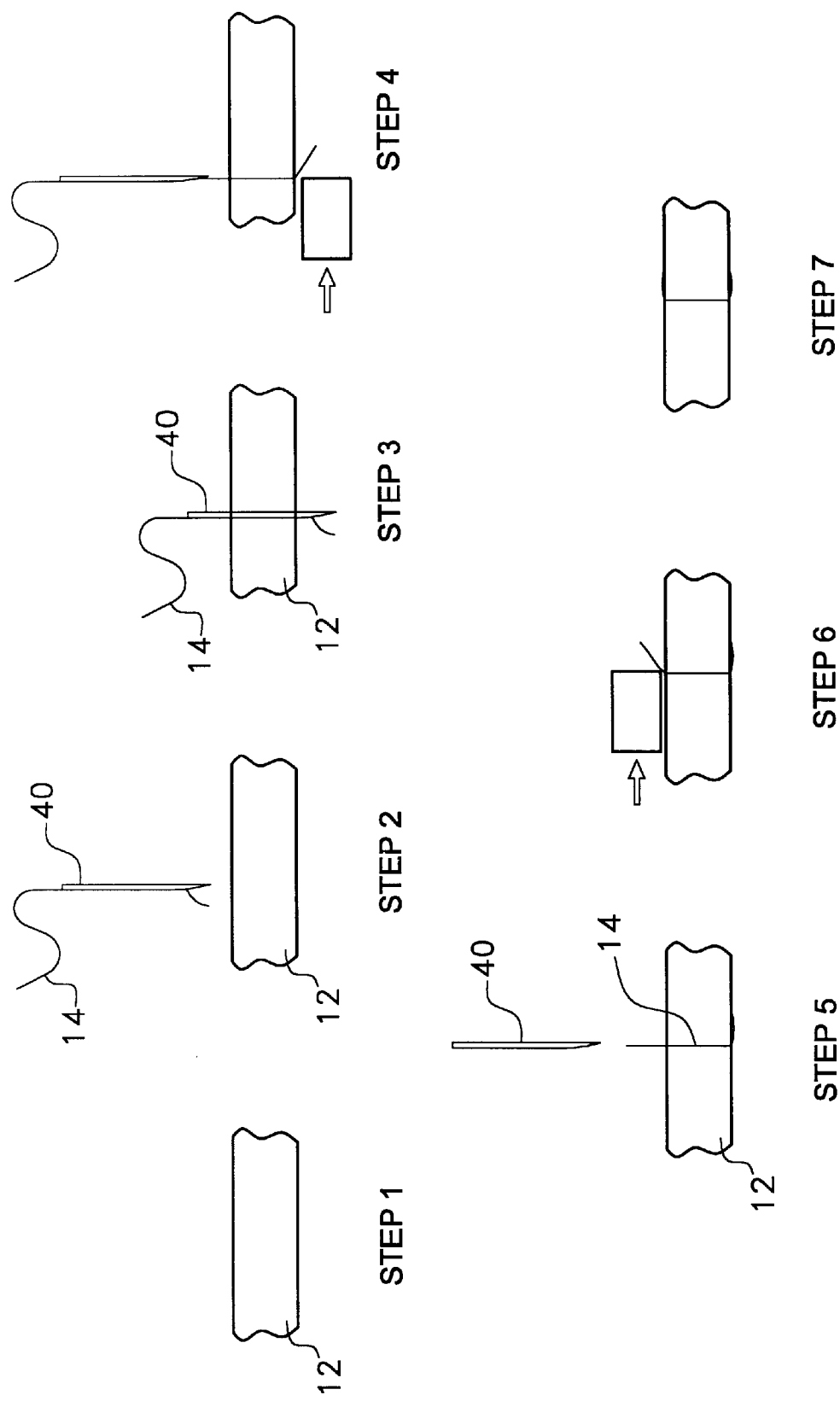
FIG. 2 is a method flow schematic illustrating method steps in an exemplary method of manufacture for the elastomeric connector.

Referring to FIG. 2, an exemplary method of manufacture is illustrated. In order to manufacture an elastomeric connector 10 (FIG. 1) in accordance with the present invention, a sheet of the dielectric substrate 12 is first provided. (See step 1.) The sheet of the dielectric substrate 12 is then placed in a programmable sewing machine 30 that is threaded with the conductive wire 14 to be used in the elastomeric connector. (See step 2.) A desired pattern is programmed into the programmable sewing machine. The desired pattern contains the selected sewn pattern pitch of the segments of conductive wire 14 in all areas of the elastomeric connector.

The programmable sewing machine uses a needle 40 that advances the conductive wire through the dielectric substrate 12. (See step 3). Once the conductive wire 14 passes through the bottom surface of the dielectric substrate the conductive wire 14 is bent along the exterior of the bottom surface of the dielectric substrate. (See step 4). As the needle 40 withdraws from the dielectric substrate 12, the conductive wire 14 is again cut a predetermined distance over the top surface of the dielectric substrate. (See step 5). The conductive wire is then bent down over the top surface of the dielectric substrate 12 to complete the staple-shaped configuration for that segment of conductive wire 14. (See step 6). The process is continued until the area selected to contain the segments of conductive wire are filled with the segments of conductive wire at the density desired.

Figure 3:
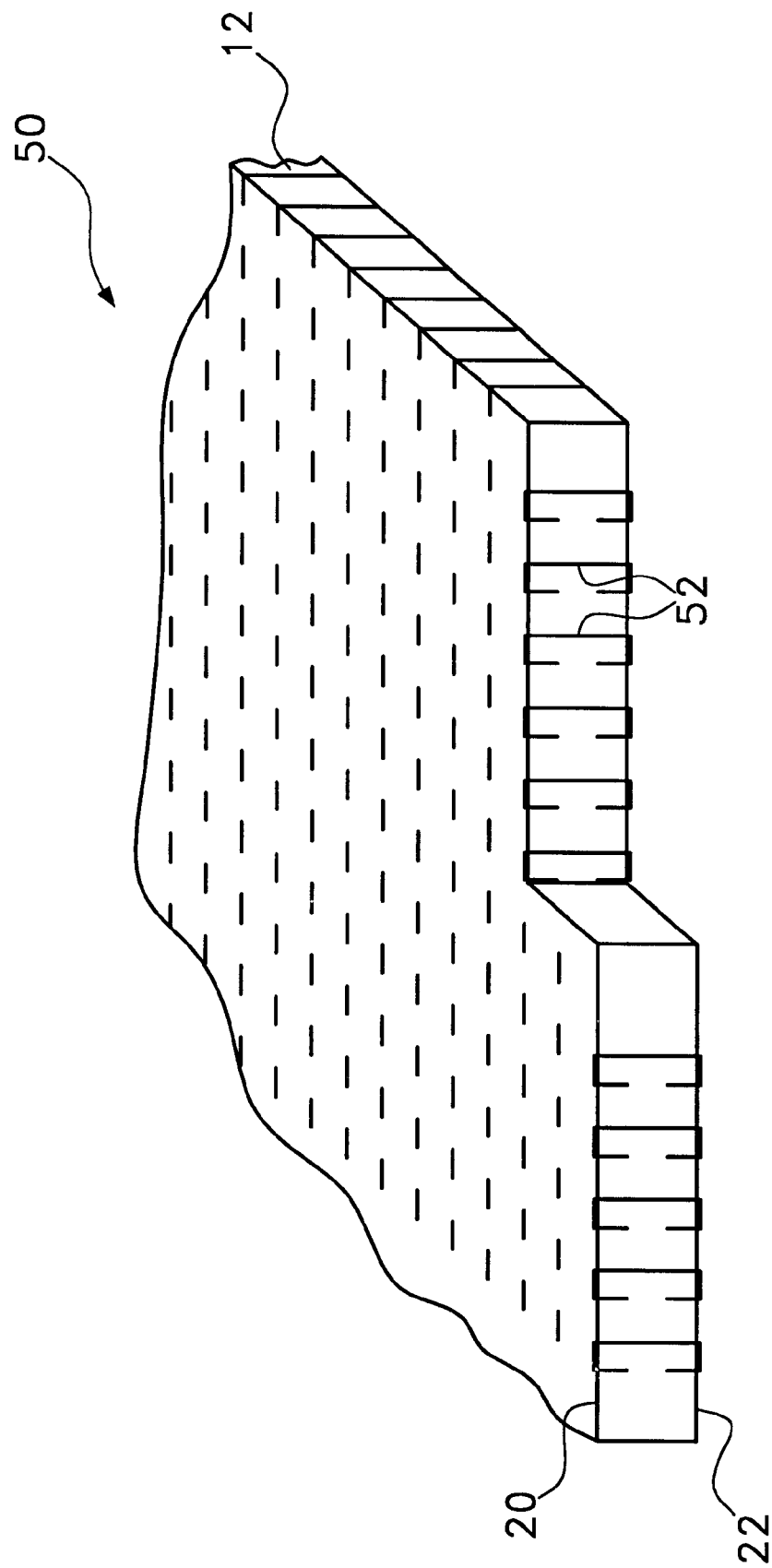
FIG. 3 is a perspective view of an exemplary embodiment of an elastomeric connector in accordance with the present invention.

Referring to FIG. 3, an alternate embodiment of an elastomeric connector 50 is shown. In this embodiment, segments of conductive wire 52 are again introduced into a preexisting section of an dielectric substrate 12. However, instead of terminating the free ends of each wire segment on the surfaces of the dielectric substrate 12, the free ends of the wire segments 52 are tucked into the dielectric substrate 12.

To produce the elastomeric connector of FIG. 3, a sewing needle is fed with a segment of conductive wire. The needle is plunged into the dielectric substrate 12. Once in the material of the dielectric substrate 12, the needle is withdrawn, thereby leaving one end of the conductive wire 52 in the dielectric substrate 12. The needle is then moved laterally to a new position over the dielectric substrate 12 and is plunged through the dielectric substrate 12 to the bottom surface 22 of the dielectric substrate. The conductive wire 52 is then cut to form a free end. A secondary insertion punch is then used to tuck the free end of the conductive wire 52 back into the material of the dielectric substrate 12. The process is continued until the area selected to contain the segments of conductive wire 52 are filled with the segments of conductive wire 52 at the density desired.

Since the conductive wire 52 passes laterally across the top surface 20 of the dielectric substrate 12 and the bottom surface 22 of the dielectric substrate 12, the conductive wire 52 resists being pressed into the elastomeric material of the substrate 12 as the substrate 12 is repeatedly compressed. Accordingly, the conductivity of the elastomeric connector 50 does not degrade over time. Furthermore, since the free ends of the different segments of conductive wire 52 are tucked into the dielectric substrate 12, the free ends do not move out of place when contacted.

It will be understood that the embodiments of the present invention described and illustrated herein are merely exemplary and a person skilled in the art can make many variations to the embodiment shown without departing from the scope of the present invention. For example, many different shaped elastomeric substrates can be used in the present invention other than what has been illustrated. It should also be understood that the various elements from the different embodiments shown can be mixed together to create alternate embodiments that are not specifically described. All such variations, modifications and alternate embodiments are intended to be included within the scope of the present invention as defined by the appended claims.

What is claimed is:

1. An elastomeric connector, comprising:
   a dielectric substrate having a top surface and a bottom surface; and
   a plurality of conductive wires advanced through said dielectric substrate, each of said plurality of conductive wires being between 0.005 inches and 0.010 inches thick, wherein each of said conductive wires has a first end and a second end and both said first end and said second end terminate at points within said dielectric substrate between said top surface and said bottom surface, and wherein portions of each of said plurality of wire lay exposed on said top surface and said bottom surface of said dielectric substrate.

2. The connector according to claim 1, wherein said dielectric substrate is elastomeric.

3. The connector according to claim 1, wherein each of said conductive wires has a first end and a second end, wherein said first end lay against said top surface of said dielectric substrate and said second end lay against said bottom surface of said dielectric substrate.

4. The connector according to claim 1, wherein each of said conductive wires has a first end that is located within said dielectric substrate, a first section that extends from said first end to said top surface of said dielectric substrate, a second section that runs laterally along said top surface, a third section that passes through said dielectric substrate to said bottom surface, a fourth section that runs laterally along said bottom surface and a fifth section that terminates within said dielectric substrate.

5. The connector according to claim 1, wherein each of said conductive wires is electrically isolated from one another.

6. A method of manufacturing an elastomeric connector, comprising the steps of:
   providing a dielectric substrate having a top surface and a bottom surface;
   advancing a plurality of conductive wires through said dielectric substrate at different points, using at least one hollow needle, wherein each of said conductive wires has a first end and a second end;
   bending each of said plurality of conductive wires against said dielectric substrate so that a segment of each of said conductive wires lays against said top surface and said bottom surface of dielectric substrate.

7. The method according to claim 6, further including the step of positioning said first end and said second end of each of said conductive wires in said dielectric substrate at points between said top surface and said bottom surface.

8. The method according to claim 6, wherein said dielectric substrate is elastomeric.

9. A method of manufacturing an elastomeric connector, comprising the steps of:
   providing a dielectric substrate having a top surface and a bottom surface;
   mechanically advancing a plurality of conductive wires through said dielectric substrate at different points, each of said conductive wires having a first end, a second end and a uniform diameter between said first end and said second end, wherein each of said conductive wires has a segment exposed on said top surface of said dielectric substrate and said bottom surface of said dielectric substrate; and
   positioning said first end and said second end of each of said conductive wires in said dielectric substrate at points between said top surface and said bottom surface.

10. An elastomeric connector, comprising:
    a dielectric substrate having a top surface and a bottom surface; and
    a plurality of conductive wires advanced through said dielectric substrate, wherein each of said conductive wires has a first end that is located within said dielectric substrate, a first section that extends from said first end to said top surface of said dielectric substrate, a second section that runs laterally along said top surface, a third section that passes through said dielectric substrate to said bottom surface, a fourth section that runs laterally along said bottom surface and a fifth section that terminates within said dielectric substrate.

11. An elastomeric connector, comprising:
    a dielectric substrate having a top surface and a bottom surface; and
    a plurality of conductive wires advanced through said dielectric substrate, each of said plurality of conductive wires being between 0.005 inches and 0.010 inches thick wherein each of said conductive wires has a first end that is located on said top surface of said dielectric substrate, a first section that runs laterally along said top surface, a second section that passes through said dielectric substrate to said bottom surface, a third section that runs laterally along said bottom surface and a second end that terminates on said bottom surface.

* * * * *